(12) United States Patent
Yi

(10) Patent No.: US 7,211,950 B2
(45) Date of Patent: May 1, 2007

(54) ORGANIC ELECTRO LUMINESCENT DISPLAY AND MANUFACTURING METHOD THEREOF

(76) Inventor: Choong Hoon Yi, Modistech, Kyunghee Business Incubation Center, Kyunghee University, Hoiki-dong, Dongdaemun-ku, Seoul, 130-701 (KR)

( * ) Notice: Subject to any disclaimer, the term of this patent is extended or adjusted under 35 U.S.C. 154(b) by 295 days.

(21) Appl. No.: 10/479,331

(22) PCT Filed: Apr. 26, 2002

(86) PCT No.: PCT/KR02/00781

§ 371 (c)(1),
(2), (4) Date: Dec. 1, 2003

(87) PCT Pub. No.: WO02/098178

PCT Pub. Date: Dec. 5, 2002

(65) Prior Publication Data

US 2004/0160175 A1 Aug. 19, 2004

(30) Foreign Application Priority Data

| May 29, 2001 | (KR) | 2001-29812 |
| Oct. 26, 2001 | (KR) | 2001-66247 |
| Mar. 28, 2002 | (KR) | 2002-16922 |

(51) Int. Cl.
*H05B 33/04* (2006.01)
(52) U.S. Cl. ........................ 313/512; 313/506; 313/509
(58) Field of Classification Search ................ 313/512, 313/504, 506, 509
See application file for complete search history.

(56) References Cited

U.S. PATENT DOCUMENTS

| 4,042,854 | A  | * | 8/1977  | Luo et al. ............. 313/505 |
| 6,016,033 | A  | * | 1/2000  | Jones et al. ............ 313/506 |
| 6,522,067 | B1 | * | 2/2003  | Graff et al. ............ 313/512 |
| 6,592,969 | B1 | * | 7/2003  | Burroughes et al. ..... 428/195.1 |
| 6,635,989 | B1 | * | 10/2003 | Nilsson et al. .......... 313/512 |
| 2001/0026124 | A1 | * | 10/2001 | Liu et al. ............... 313/504 |
| 2004/0124771 | A1 | * | 7/2004  | Sundahl et al. .......... 313/512 |

FOREIGN PATENT DOCUMENTS

| JO | 07 254486   | 3/1995 |
| JP | 07 153571   | 6/1995 |
| JP | 08 236271   | 9/1996 |
| JP | 09 204981   | 5/1997 |
| JP | 2001 102167 | 4/2001 |
| KR | 1999 0041051 | 6/1999 |

OTHER PUBLICATIONS

Van Zant, P. (2000) "Microchip Fabrication: A Practical Guide to Semiconductor Processing", Fourth Edition, Chapter 8, pp. 198-202, published by McGraw-Hill.

* cited by examiner

*Primary Examiner*—Nimeshkumar D. Patel
*Assistant Examiner*—Matt Hodges
(74) *Attorney, Agent, or Firm*—Knobbe, Martens, Olson & Bear LLP

(57) ABSTRACT

An organic light emitting diode includes a lower substrate, luminous element provided with upper and lower electrodes and disposed on the lower substrate, a shielding layer disposed on the luminous element for shielding outer moisture, the shielding layer being formed of at least one layer, and an upper substrate disposed on the shielding layer.

33 Claims, 6 Drawing Sheets

- S1 — Manufacturing the Organic Luminous element
- S3 — Laminating the dry film resist on the upper electrode
- S5 — Light exposure process
- S6 — Developing process
- S7 — Drying
- S9 — Depositing UV hardening resin
- S11 — Bonding the upper substrate
- S13 — Hardening UV resin
- S15 — Cutting
- S17 — Depositing sealant

FIG.10

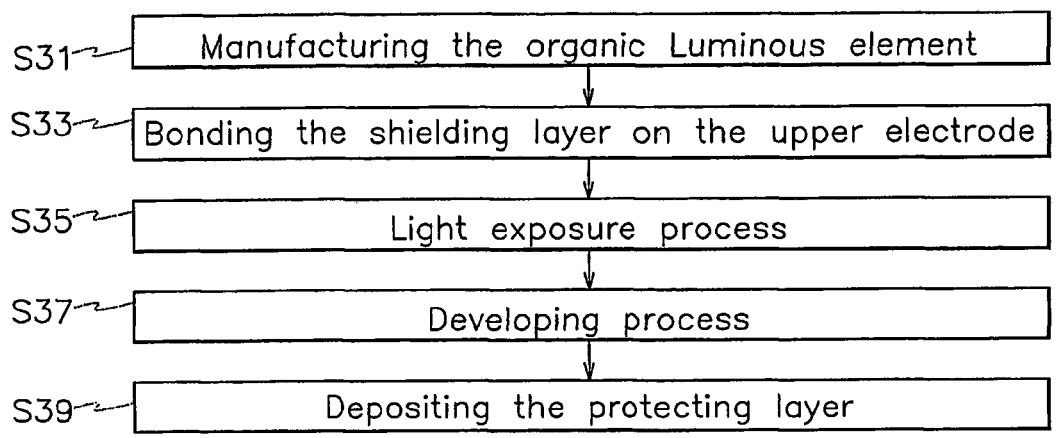

- S31 — Manufacturing the organic Luminous element
- S33 — Bonding the shielding layer on the upper electrode
- S35 — Light exposure process
- S37 — Developing process
- S39 — Depositing the protecting layer

FIG.11

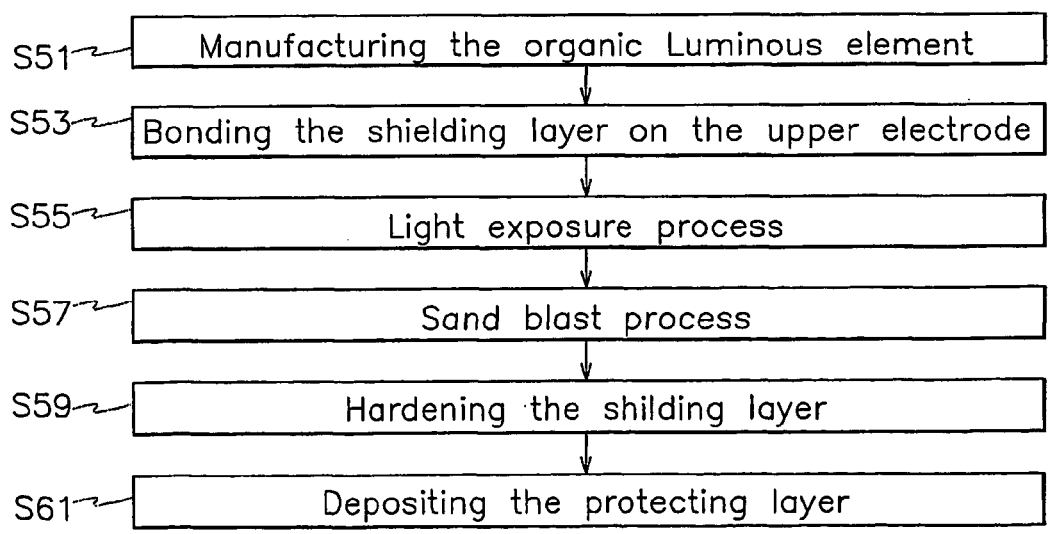

- S51 — Manufacturing the organic Luminous element
- S53 — Bonding the shielding layer on the upper electrode
- S55 — Light exposure process
- S57 — Sand blast process
- S59 — Hardening the shilding layer
- S61 — Depositing the protecting layer

ORGANIC ELECTRO LUMINESCENT DISPLAY AND MANUFACTURING METHOD THEREOF

This is the U.S. national phase under 35 U.S.C. § 371 of International Application No. PCT/KR02/00781, filed Apr. 26, 2002, which claims priority to Korean Application Nos. 2001/29812, filed May 29, 2001; 2001/66247, filed Oct. 26, 2001; and 2002/16922, filed Mar. 28, 2002.

BACKGROUND OF THE INVENTION (a) Field of the Invention

The present invention relates to an organic light emitting diode and, more particularly, to an organic light emitting diode that is designed being protected from moisture by being encapsulated, thereby improving luminous efficiency and life span.

(b) Description of Prior Art

Generally, an organic light emitting diode is a luminous element that emits light by an electron and an electron hole that are disappeared after being paired with each other when an electric charge is diffused on an organic electric field luminous layer provided between an electron hole diffusing electrode (a positive electrode) and an electron diffusing electrode (a negative electrode). Such an organic light emitting diode has an advantaged of being driven at a voltage lower than that required for driving an inorganic light emitting diode or a plasma display panel (PDP) by 10V.

In addition, since the organic light emitting diode is thin, light, and good in a sense of color, it has lately attracted considerable attention as a next generation flat display. The organic light emitting diode may be formed of a flexible substrate such as a plastic film.

However, since the organic light emitting diode cannot stand moisture and oxygen, its luminous efficiency and life span are steeply deteriorated when it is exposed to the air or outer moisture is infiltrated in the display. Accordingly, to protect the display from the moisture and oxygen, a metal plate such as a stainless steel is disposed on the organic light emitting diode through a well-known encapsulation process to prevent the display from directly exposed to the air.

In the encapsulation process, the metal plate and the organic light emitting diode are attached to each other by an adhesive or a UV hardening agent. However, this has a limitation in maintaining the property of the organic light emitting diode as the sealing effect cannot be sufficiently obtained at the attaching portion. Further more, the process is complicated.

SUMMARY OF THE INVENTION

Therefore, the present invention has been made in an effort to solve the above-described problems of the prior art. It is an objective of the present invention to provided an organic light emitting diode that has an encapsulation structure protecting organic matter and an electrode from outer moisture, thereby improving luminous efficiency of the diode and increasing life span.

It is another objective of the present invention to provide a method for processing an encapsulation structure of an organic light emitting diode, which can prevent the luminous efficiency and life span of the diode from deteriorating.

To achieve the above objectives, the present invention provides an organic light emitting diode comprising a lower substrate, a luminous element provided with upper and lower electrodes and disposed on the lower substrate, a shielding layer disposed on the luminous element for shielding outer moisture, the shielding layer being formed of at least one layer, and an upper substrate disposed on the shielding layer.

According to another aspect, the present invention provides a method for manufacturing an organic light emitting diode, comprising the steps of disposing a shielding layer on an upper electrode of a luminous element, exposing an image signal input pad terminal to an luminous upper and lower electrodes through a light exposing and developing process, depositing a UV hardening resin on a portion where an end of a shielding layer contacts the upper and lower electrodes of the luminous element, attaching an upper substrate to a lower substrate, and hardening the UV hardening resin.

BRIEF DESCRIPTION OF THE DRAWINGS

FIG. 10 is a flowchart illustrating a method for manufacturing an organic light emitting diode according to a second embodiment of the present invention; and FIG. 11 is a flowchart illustrating a method for manufacturing an organic light emitting diode according to a third embodiment of the present invention.

DETAILED DESCRIPTION OF EMBODIMENTS

The present invention will be described more in detail hereinafter in conjunction with the accompanying drawings.

Figure 1:
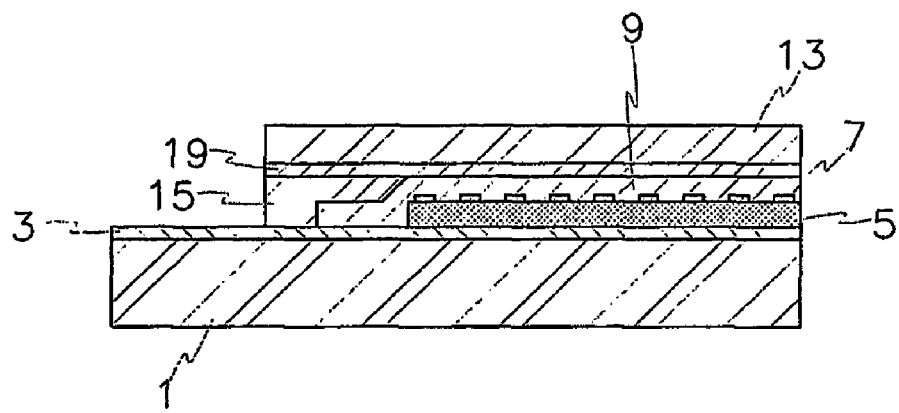
FIG. 1 is a sectional view of an organic light emitting diode according to a first embodiment of the present invention.

FIG. 1 shows an organic light emitting diode according to a first embodiment of the present invention. The inventive diode comprises lower and upper substrates 1 and 13 and an element 5 having lower and upper electrodes 3 and 7, the luminous element 5 being disposed between the lower and upper substrates 1 and 13.

Attached on the luminous element 5 having the positive and negative electrodes 3 and 7 is a shielding layer formed by laminating a photosensitive dry film (9, hereinafter referred as "dry film resist"). The shielding layer formed of the dry film resist 9 can be laminated with more than one layer.

The laminating of the shielding layer after the luminous element is formed is conducted under a pressure of $1-10^{-4}$ torr, and a moisture rate of 1000–0.1 ppm.

The luminous element 5 is disposed between the lower and upper substrates 1 and 13. An antireflection coating layer 19 is formed under the upper substrate 13. A UV hardening resin 15 is deposited on an end of the dry film resist 9 and a portion where the upper and lower substrates 1 and 13 of the luminous element 5 contact each other.

Although the antireflection coating layer 19 disposed under the upper substrate 13, the present invention is not limited to this. That is, the dry film resist 9 may be designed functioning as the antireflection layer by itself. Alternatively, the antireflection coating layer 19 may be disposed on an upper or lower surface of the dry film resist 9.

Figure 2:
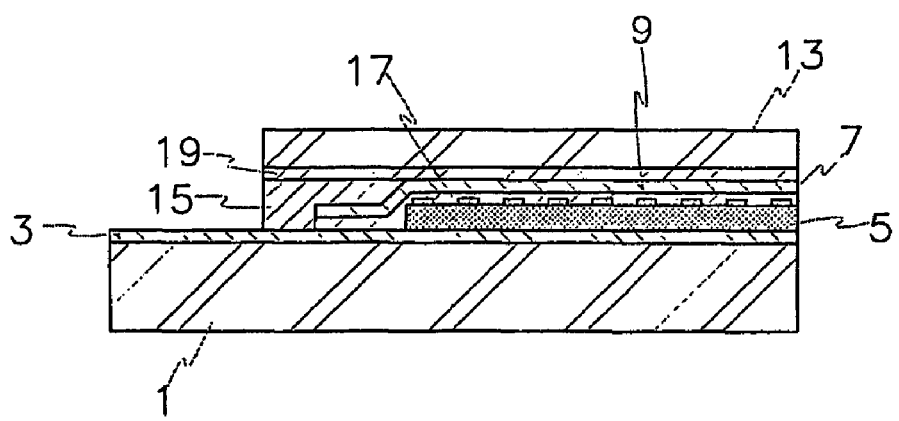
FIG. 2 is a sectional view of an organic light emitting diode according to a second embodiment of the present invention.
Figure 3:
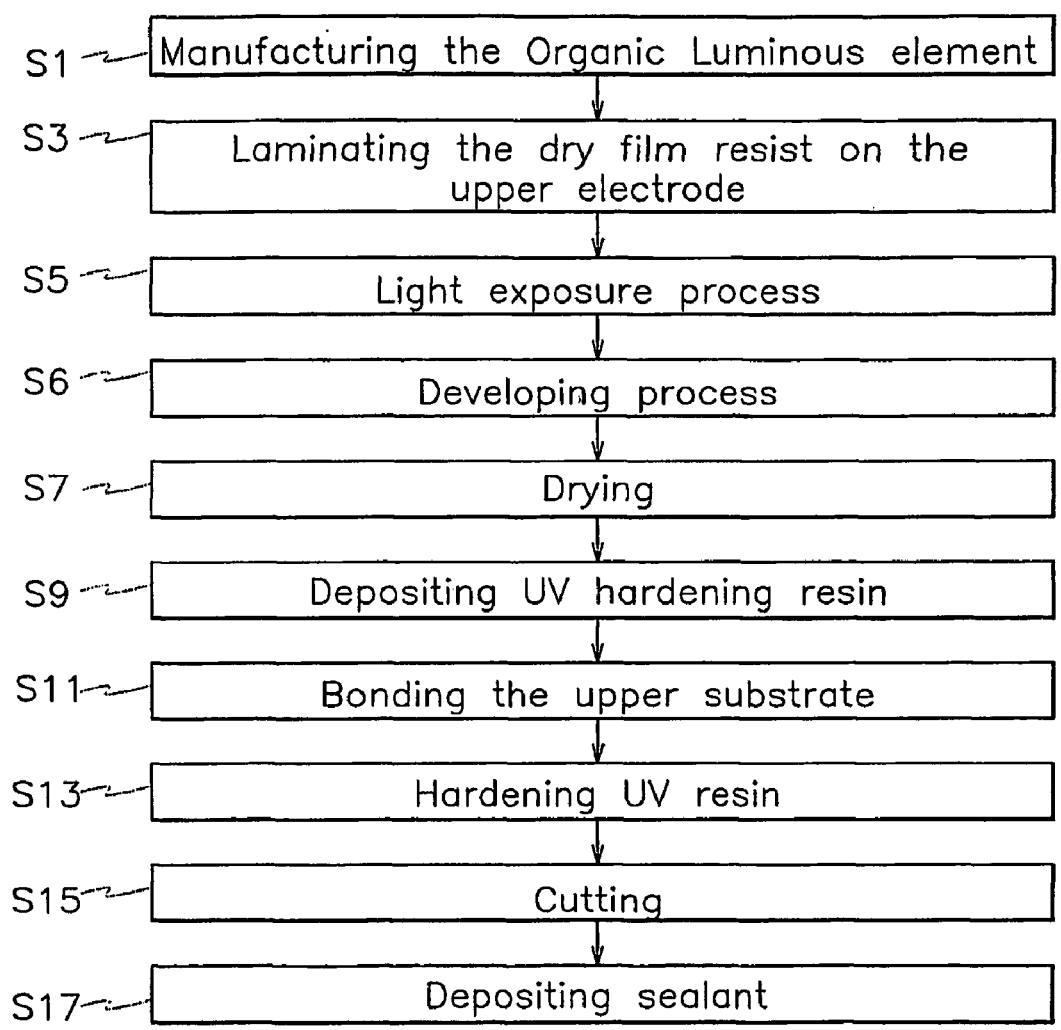
FIG. 3 is a flowchart illustrating a method for manufacturing an organic light emitting diode according to a first embodiment of the present invention.

FIG. 2 shows an organic light emitting diode according to a second embodiment of the present invention. In this embodiment, a protecting layer 17 for shielding moisture and oxygen is further provided under the shielding layer formed of the dry film resist 9.

The protecting layer 17 can be selected from the group consisting of a transparent inorganic layer, a transparent organic layer and a semitransparent metal layer. The protecting layer 17 may be formed in a single layer or a multi-layer selected from the group consisting of an inorganic/inorganic layer, an inorganic/organic layer, and an organic/organic layer.

In the first embodiment, although the dry film resist 9 is laminated on the luminous element 5 to form the shielding layer, in this embodiment, the shielding layer may be formed by depositing and drying a transparent photosensitive agent on the luminous element 5. The shielding layer is protected by a substrate deposited with an antireflection layer and disposed on the luminous element 5.

A method for manufacturing the above-described organic light emitting diode will be described hereinafter.

First, after the organic luminous element is manufacture (S1), the shielding layer is formed by laminating the dry film resist on the upper electrode where the organic luminous element will be disposed or depositing and drying the transparent photosensitive agent on the organic luminous element (S3). Then, a light exposure process is performed to expose a pad end for inputting image signal to the upper and lower electrodes (S5). After a developing process (S6), a portion of the electrode for the pad is exposed and dried (S7). Next, the UV hardening resin is deposited on the end of the dry film and a portion where the upper and lower electrodes contact each other (S9), after which the upper substrate on which the antireflection film is disposed on the shielding layer formed of the dry film resist and bonded with the lower substrate (S11). Next, the UV hardening resin is hardened by means of a UV lamp (S13), after which the upper and lower substrates are cut in a predetermined shape by means of a glass cutter (S15) and sealant is deposited on an end of the upper substrate (S17) so as to dually protect the display from outer moisture.

The laminating of the shielding layer after the luminous element is formed is conducted under a pressure of $1-10^{-4}$ torr and a moisture rate of 1000 ppm–0.1 ppm.

At this point, the light transmissivity of the dry film resist can be in a range selected from the group consisting of 0–50%, 50–80% and 80–98%.

In addition, the dry film resist may be colored or colorless.

Since the light exposure process for forming the dry film resist and the light exposure process of the UV hardening agent to attach the upper and lower substrates each other are both conducted on the dry film resist or the upper substrate, the element may be damaged by ultraviolet rays. To prevent this, it is preferable to use a colored dry film resist having a light transmissivity less than 80%, preferably 50%.

However, when the upper electrode is formed of a transparent material, the colored dry film resist having a low light transmissivity may deteriorate the luminous efficiency. At this point, it is preferable to use a material having the light transmissivity above 80%. In addition, to minimize the damage of the element by the ultraviolet rays, a material capable of shielding the ultraviolet rays is more preferable.

In addition, a refractive index of the dry film resist is designed having a range selective from the group consisting of 1.2–1.5, 1.5–2.0, and 2.0–3.0.

To add an antireflection function to the dry film resist, the dry film resist should be designed having a different reflection index from the upper substrate. At this point, when the upper substrate is formed of a glass, the dry film resist is formed having a refraction index of 1.2–1.5 or 2.0–3.0 which differs from that of a normal glass. However, when the upper substrate is not glass or is provided with a transparent protecting layer formed on an upper or lower surface of the substrate or a lower surface of the dry film resist, the refraction index of the dry film resist may be in a range of 1.5–2.0 depending on the refraction indexes of the layers.

Figure 4:
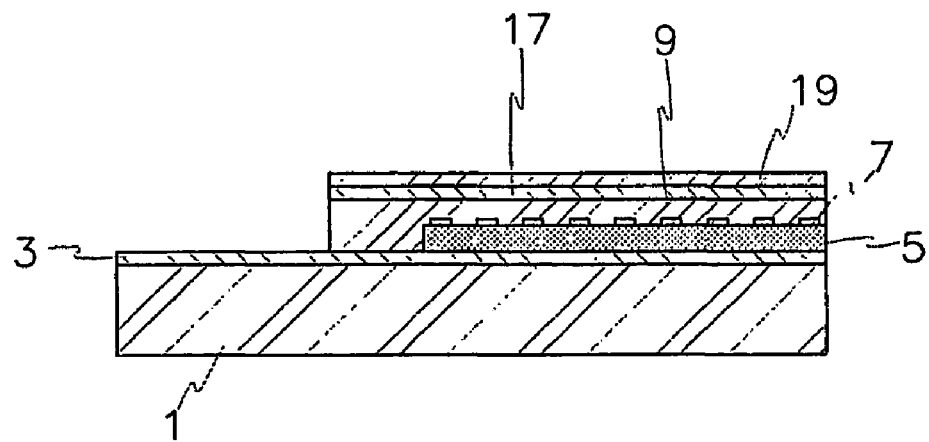
FIG. 4 is a sectional view of an organic light emitting diode according to a third embodiment of the present invention.

FIG. 4 shows an organic light emitting diode according to a third embodiment of the present invention. A luminous element 5 provided with electrodes 3 and 7 is disposed on a lower substrate 1 and a shielding layer 9 is disposed on the luminous element 5. A protecting layer 17 is disposed on the shielding layer 9. An antireflection coating layer 19 is formed on the protecting layer 17. This embodiment is identical to the first embodiment except that the upper substrate disclosed in the first embodiment is omitted. By omitting the upper substrate, the manufacturing process may be more simplified and the manufacturing cost as well as the thickness and weight can be reduced.

In this third embodiment, although the protecting layer 17 is disposed on the shielding layer 9, the protecting layer 17 as well as the antireflection coating layer 19 may be omitted to make the display simple.

Figure 5:
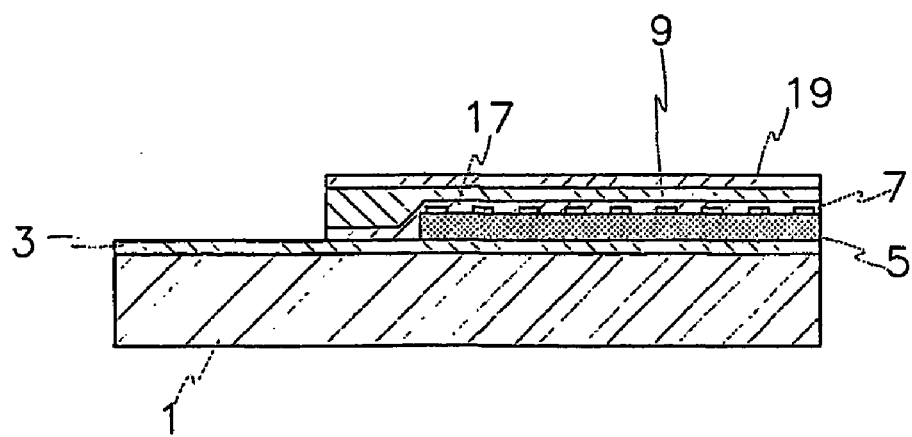
FIG. 5 is a sectional view of an organic light emitting diode according to a fourth embodiment of the present invention.

FIG. 5 shows an organic light emitting diode according to a fourth embodiment of the present invention. A luminous element 5 provided with electrodes 3 and 7 is disposed on a lower substrate 1 and a protecting layer 17 is disposed on the luminous element 5. A shielding layer 9 is disposed on the protecting layer 17. While the shielding layer 9 in the third embodiment is disposed on the luminous element 5, the shielding layer 9 in the fourth embodiment is disposed on the protecting layer 17 disposed on the luminous element 5. That is, this embodiment shows that the display can be designed in a various disposition. In addition, an antireflection coating layer 19 is disposed on the shielding layer 9.

Since the shielding layer 9 and the protecting layer 17 in the third and fourth embodiments are identically designed to those in the first and second embodiments, the detailed description thereof will be omitted herein.

In the third and fourth embodiment, it is preferable that the shielding layer 9 is formed of more than one layer. That is, the shielding layer 9 can be formed of a single layer or a multi-layer.

In the third and fourth embodiments, the protecting layer 17 is provided to further enhance the protection effect of the moisture that may be introduced into the luminous element 5. Particularly, when 15 the protecting layer 17 is disposed as the uppermost layer, it can also have a function for preventing the shielding layer 9 from be damaged. The protecting layer 17 is identical to that in the first and second embodiments, the detailed description of which will be omitted herein. However, in the third and fourth embodiments, it is preferable that the protecting layer 17 has a thickness of 0.01–300 μm.

Particularly, in the third and fourth embodiments, when the protecting layer 17 is provided with the upper substrate omitted, there is an advantage of designing a new optical layer where the front emission of the display is realized upward.

A method for manufacturing the organic light emitting diode described in the third and fourth embodiments will be described in detail in conjunction with FIGS. 10 and 11.

After the lower substrate 1 is first prepared, the luminous element 5 is manufactured (S31). The luminous element 5 is provided with upper and lower electrodes and attached on the lower substrate 1. The shielding layer 9 is bonded on the electrode 7 disposed on the element 5. The shielding layer 9 is formed in a same manner described in connection with the first and second embodiments.

Then, the shielding layer 9 is exposed to the light (S35) and developed (S37), and then the protecting layer 17 is deposed (S39). If required, the antireflection coating layer 19 may be formed on the protecting layer 17.

FIG. 11 shows a flowchart illustrating another example for forming the protecting layer 9 described in the third and fourth embodiments. That is, the method for forming the shielding layer is different from that of the third embodiment. The shielding layer 9 is bonded on the upper electrode and exposed to the light, after which it goes through a sand blast process and is hardened.

That is, after the luminous element is first manufactured (S51), the shielding layer 9 is bonded on the upper electrode (S53). Then, the shielding layer 9 is exposed to the light (S55), after which it goes through a sand blast process (S57) and is hardened (S59). The protecting layer 17 is deposited on the shielding layer 9 (S61).

The protecting layer 17 described in the third and fourth embodiments can be formed of at least one layer selected from the group consisting of an inorganic layer, an organic layer and a metal layer. The protecting layer 17 may be designed to function as an antireflection coating layer.

Preferably, the protecting layer 17 is designed having a transmissivity of a range selected from the group consisting of 0–50%, 50–80% and 80–98%. This means that the display can be variously designed depending on the give conditions.

The protecting layer 17 may be colored or colorless and designed having a refraction index of a range selected from the group consisting of 1.2–1.5, 1.5–20 and 2.0–30.

By omitting the upper substrate in the third and fourth embodiments, the display has a simple structure and the manufacturing process thereof can be more simplified, while obtaining the identical effect to those of the first and second embodiments.

FIGS. 6 to 9 shows fifth to eighth embodiments of the present invention, respectively. In these embodiments, to further enhance the encapsulation effect, the shielding layer 9 on the protecting layer 17 are formed on the luminous element 5 in a multi-layer structure.

Figure 6:
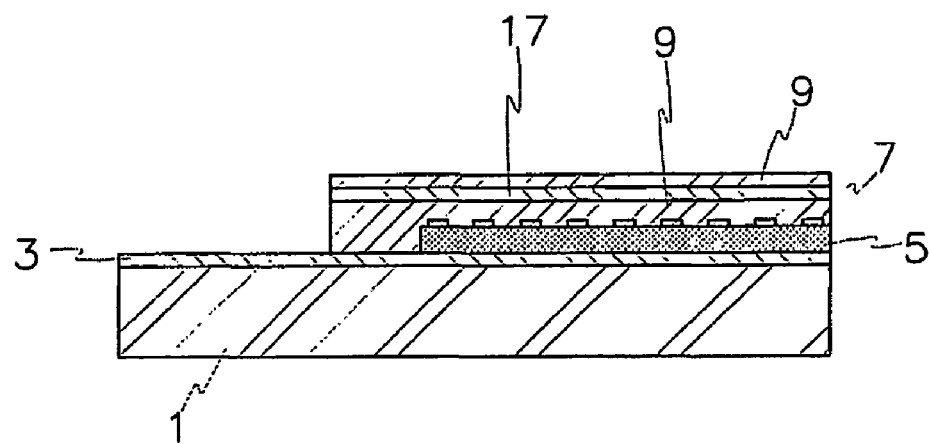
FIG. 6 is a sectional view of an organic light emitting diode according to a fifth embodiment of the present invention.

That is, in the fifth embodiment depicted in FIG. 6, a luminous element 5 provided with electrodes 3 and 7 is disposed on a lower substrate 1 and a first shielding layer 9 for shielding the moisture is disposed on the luminous element 5. A protecting layer 17 is disposed on the shielding layer 9 and a second shielding layer 9 is further disposed on the protecting layer 17.

Figure 7:
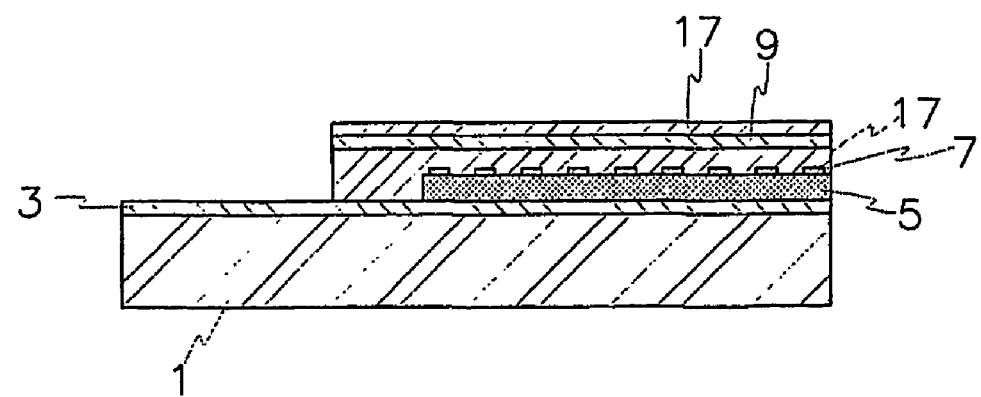
FIG. 7 is a sectional view of an organic light emitting diode according to a sixth embodiment of the present invention.

In the sixth embodiment depicted in FIG. 7, a luminous element 5 provided with electrodes 3 and 7 is disposed on a lower substrate 1 and a first protecting layer 17 is disposed on the luminous element 5. A shielding layer 9 for shielding the moisture is disposed on the first protecting layer 17. A second protecting layer 17 is further disposed on the shielding layer 9.

Figure 8:
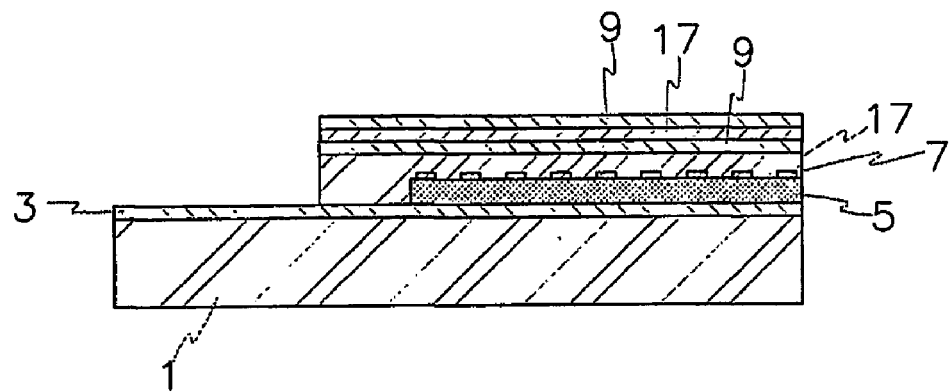
FIG. 8 is a sectional view of an organic light emitting diode according to a seventh embodiment of the present invention.

In the seventh embodiment depicted in FIG. 8, a luminous element 5 provided with electrodes 3 and 7 is disposed on a lower substrate 1 and a first protecting layer 17 is disposed on the luminous element 5. A first shielding layer 9 for shielding the moisture is disposed on the first protecting layer 17. A second protecting layer 17 is further disposed on the shielding layer 9 and a second shielding layer 9 is further disposed on the protecting layer 17.

Figure 9:
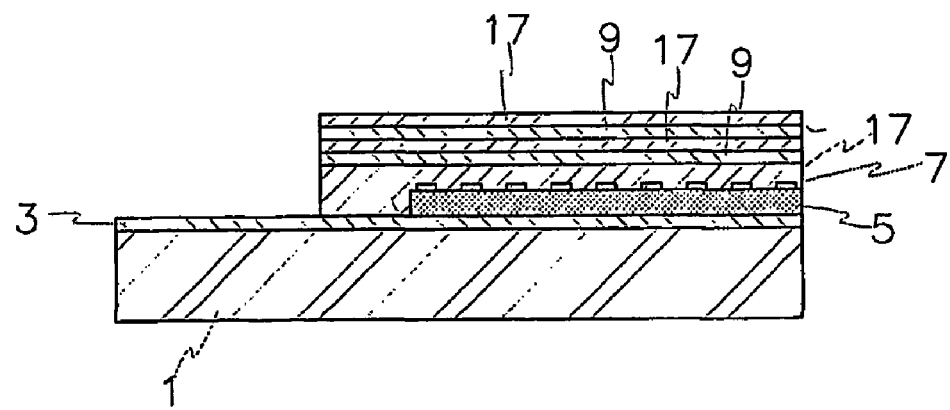
FIG. 9 is a sectional view of an organic light emitting diode according to an eighth embodiment of the present invention.

In the eighth embodiment depicted in FIG. 9, a luminous element 5 provided with electrodes 3 and 7 is disposed on a lower substrate 1 and a first protecting layer 17 is disposed on the luminous element 5. A first shielding layer 9 for shielding the moisture is disposed on the first protecting layer 17. A second protecting layer 17 is further disposed on the shielding layer 9 and a second shielding layer 9 is further disposed on the protecting layer 17. A third protecting layer 17 is further disposed on the second shielding layer 9.

In the fifth to eighth embodiments, since shielding layer 9 and the protecting layer are identical to those of the above embodiments, the description thereof will be omitted herein.

The fifth to eighth embodiments further enhances the encapsulation effect of the luminous element 5.

As described above, the present invention provides a laminating structure of the dry film resist or a technology for depositing a transparent photosensitive agent on the luminous element, thereby improving luminous efficiency of the display and increasing life span.

In addition, the present invention provides a manufacturing process simplified while providing a simple structure reducing the thickness and weight of the display.

What is claimed is:

1. An organic light emitting diode comprising:
   a lower substrate;
   a luminous element provided with upper and lower electrodes and disposed on the lower substrate; and
   a shielding layer disposed on the luminous element for shielding outer moisture, the shielding layer being formed of at least one layer, wherein the shielding layer disposed on the luminous element is formed of a dry film resist laminated on the luminous element.

2. The organic light emitting diode of claim 1 further comprising an upper substrate disposed on the shielding layer.

3. The organic light emitting diode of claim 1 further comprising a protecting layer disposed on the shielding layer and a second shielding layer disposed on the protecting layer.

4. The organic light emitting diode of claim 1 further comprising a first protecting layer disposed on the luminous element and a second protecting layer disposed on the shielding layer.

5. The organic light emitting diode of claim 1 further comprising:
   a first protecting layer disposed on the luminous element;
   a second protecting layer disposed on the first shielding layer; and a second shielding layer disposed on the second protecting layer.

6. The organic light emitting diode of claim 1 further comprising:
a first protecting layer disposed on the luminous element;
a second protecting layer disposed on the first shielding layer;
a second shielding layer disposed on the second protecting layer; and
a third protecting layer disposed on the second shielding layer.

7. The organic light emitting diode of claim 1 wherein the shielding layer disposed on the luminous element is formed by a transparent photosensitive agent.

8. The organic light emitting diode of claim 2 wherein the upper substrate is provided at its bottom surface with an antireflection coating layer.

9. The organic light emitting diode of claim 1 wherein the shielding layer is formed of an antireflection layer.

10. The organic light emitting diode of claim 2 wherein the shielding layer is provided with a protecting layer selected from the group consisting of an inorganic layer, an organic layer and a semitransparent metal layer.

11. The organic light emitting diode of claim 1 wherein the shielding layer is provided at its upper or lower surface with a protecting layer selected from the group consisting of an inorganic layer, an organic layer and a semi-transparent metal layer.

12. The organic light emitting diode of claim 3 wherein the protecting layer is provided at its upper or lower surface with an antireflection coating layer.

13. The organic light emitting diode of claim 1 wherein a protecting layer is formed of a multilayer selected from the group consisting of an inorganic/inorganic layer, an inorganic/organic layer, and an organic/organic layer.

14. The organic light emitting diode of claim 2 wherein a UV hardening resin is deposited on a portion where an end of the shielding layer contacts the upper and lower electrodes of the luminous element.

15. The organic light emitting diode of claim 1 wherein a protecting layer disposed on the shielding layer is a metal layer.

16. The organic light emitting diode of claim 2 wherein the upper and lower substrates are formed of a glass or a synthetic resin film.

17. The organic light emitting diode of claim 1 wherein a transmissivity of the dry film resist is in a range of 0–50%.

18. The organic light emitting diode of claim 1 wherein a transmissivity of the dry film resist is in a range of 50–80%.

19. The organic light emitting diode of claim 1 wherein a transmissivity of the dry film resist is in a range of 80–98%.

20. The organic light emitting diode of claim 1 wherein the dry film resist is colored or colorless.

21. The organic light emitting diode of claim 1 wherein a refraction index of the dry film resist is in a range of 1.2–1.5.

22. The organic light emitting diode of claim 1 wherein a refraction index of the dry film resist is in a range of 1.5–2.0.

23. The organic light emitting diode of claim 1 wherein a refraction index of the dry film resist is in a range of 2.0–3.0.

24. The organic light emitting diode of claim 1 wherein a thickness of the dry film resist is in a range of 2–300 μm.

25. The organic light emitting diode of claim 3 wherein a transmissivity of any one of the protecting or shielding layers is in a range of 0–50%.

26. The organic light emitting diode of claim 3 wherein a transmissivity of any one of the protecting or shielding layers is in a range of 50–80%.

27. The organic light emitting diode of claim 3 wherein a transmissivity of any one of the protecting or shielding layers is in a range of 80–98%.

28. The organic light emitting diode of claim 3 wherein any one of the protecting or shielding layers is colored or colorless.

29. The organic light emitting diode of claim 3 wherein a reflection index of any one of the protecting or shielding layers is in a range of 1.2–1.5.

30. The organic light emitting diode of claim 3 wherein a reflection index of any one of the protecting or shielding layers is in a range of 1.5–2.0.

31. The organic light emitting diode of claim 3 wherein a reflection index of any one of the protecting or shielding layers is in a range of 2.0–3.0.

32. The organic light emitting diode of claim 3 wherein a thickness of any one of the protecting or shielding layers is in a range of 0.01–300 μm.

33. The organic light emitting diode of claim 1 wherein the lower substrate is formed of a glass or a plastic film.

* * * * *